(12) United States Patent
Yokota et al.

(10) Patent No.: US 6,623,235 B2
(45) Date of Patent: Sep. 23, 2003

(54) ROBOT ARM EDGE GRIPPING DEVICE FOR HANDLING SUBSTRATES USING TWO FOUR-BAR LINKAGES

(75) Inventors: Chuckson Yokota, Fremont, CA (US); Joseph Mann, San Jose, CA (US); Jean-Pascal Rouland, Fremont, CA (US); Malek Charif, San Jose, CA (US); Ted Hwang, Mountain View, CA (US)

(73) Assignee: PRI Automation, Inc., Chelmsford, MA (US)

( * ) Notice: Subject to any disclaimer, the term of this patent is extended or adjusted under 35 U.S.C. 154(b) by 0 days.

(21) Appl. No.: 10/120,673

(22) Filed: Apr. 11, 2002

(65) Prior Publication Data

US 2003/0053902 A1 Mar. 20, 2003

(Under 37 CFR 1.47)

Related U.S. Application Data

(60) Provisional application No. 60/283,513, filed on Apr. 11, 2001.

(51) Int. Cl.[7] .............................................. B25J 15/00
(52) U.S. Cl. ...................... 414/744.8; 294/99.1; 901/39
(58) Field of Search .......................... 414/744.3, 744.5, 414/744.8, 741; 901/39; 294/99.1

(56) References Cited

U.S. PATENT DOCUMENTS

| 3,807,029 A | 4/1974 | Troeger | ........................ 29/436 |
|---|---|---|---|
| 3,811,665 A | 5/1974 | Seelig | ........................ 267/160 |
| 3,813,089 A | 5/1974 | Troeger | ........................ 267/160 |
| 3,825,992 A | 7/1974 | Troegar | ........................ 29/436 |
| 5,702,228 A | * 12/1997 | Tamai et al. | ............... 901/39 X |
| 5,810,935 A | * 9/1998 | Lee et al. | .................. 901/39 X |
| 6,155,773 A | * 12/2000 | Ebbing et al. | ........... 414/744.5 |

* cited by examiner

Primary Examiner—Donald W. Underwood
(74) Attorney, Agent, or Firm—Weingarten, Schurgin, Gagnebin & Lebovici LLP

(57) ABSTRACT

An edge gripping device for a robot arm grips and ungrips substrates, such as semiconductor wafers. A base is fixed to an end of the robot arm. A blade, having a distal contact location thereon, and a pusher bar, having preferably two proximal contact locations thereon, are movably mounted to the base via a linkage mechanism. The linkage mechanism includes two four-bar linkages. The first four-bar linkage has a stationary link and three movable links connected in a parallelogram configuration. The pusher bar is fixed to one of the movable links of the first linkage for movement therewith. The second four-bar linkage has a stationary link and three movable links connected in a trapezoidal configuration. The blade is fixed to one of the movable links of the second linkage for movement therewith. The two linkages share a stationary pivot point. An actuator having one end fixed with respect to the first linkage and an opposite end fixed with respect to the second linkage is operative to move the first linkage and the second linkage. The proximal contact location moves substantially horizontally and the distal contact location moves vertically and horizontally.

37 Claims, 10 Drawing Sheets

ROBOT ARM EDGE GRIPPING DEVICE FOR HANDLING SUBSTRATES USING TWO FOUR-BAR LINKAGES

CROSS REFERENCE TO RELATED APPLICATIONS

This application claims priority under 35 U.S.C. §119(e) of U.S. Provisional Application No. 60/283,513, filed Apr. 11, 2001, the disclosure of which is incorporated by reference herein.

STATEMENT REGARDING FEDERALLY SPONSORED RESEARCH OR DEVELOPMENT

N/A

BACKGROUND OF THE INVENTION

In semiconductor fabrication, circuits are formed on wafers of a semiconductor material such as silicon. A single crystal of the semiconductor material is sliced into thin wafers and the wafers are transported between various stations, such as processing stations, storage stations, or queuing stations, in the fabrication plant. The fabrication plant must be kept clean to prevent contamination of the semiconductor wafers. The wafers are accordingly handled very carefully in sealed cleanroom environments.

Robots are often used to transport the wafers between processing, storage, queuing or other stations. A typical robot includes an arm movable vertically and in a horizontal plane. An end effector on the end of the arm picks up and places the wafer. The end effector may include a mechanism for holding onto the wafer to prevent the wafer from slipping or otherwise becoming damaged while the robot arm is carrying it.

In certain semiconductor applications, the wafer includes an alignment feature, such as a notch or flat, along one edge that is used to align the wafer in a desired orientation prior to delivering the wafer to a processing station. A pre-aligner device is often used to accomplish this alignment. Before delivering the wafer to the processing station, the robot arm deposits the wafer at the pre-aligner device, which rotates the wafer until the notch or flat is properly oriented. The robot arm then picks the wafer up again, in the proper orientation, and delivers the wafer to the processing station.

SUMMARY OF THE INVENTION

The present invention relates to an edge gripping device for a robot that grips the edges of a substrate, such as a semiconductor wafer. The edge gripping device provides proximal and distal points of substrate contact that move in synchronized motion toward a substrate to grip it and away from the substrate to ungrip it. The motion is achieved via two four-bar linkages that move the proximal contact(s) in a substantially horizontal plane and the distal contact(s) both vertically and horizontally. Preferably, at least three contact locations are provided to securely hold the substrate.

More particularly, the edge gripping device includes a base fixed to an end of the robot arm. A distally extending blade and a proximal pusher bar are movably mounted to the base. A linkage mechanism movably mounting the blade and the pusher bar to the base is formed of two four-bar linkages that share a stationary link plate and a movable link arm. The first four-bar linkage has a stationary link fixed with respect to the base and three movable links connected in a parallelogram configuration. The proximal member is fixed to one of the movable links of the first linkage for movement therewith. The second four-bar linkage has a stationary link fixed with respect to the base and three movable links connected in a trapezoidal configuration. The blade is fixed to one of the movable links of the second linkage for movement therewith. The trapezoidal configuration provides both horizontal and vertical components of motion for the distal contact(s).

An actuator is fixed at one end with respect to a moving link of the first linkage and at an opposite end with respect to a moving link of the second linkage. The actuator is operative to move the first linkage and the second linkage to effect movement of the proximal and distal contacts between a closed position in which a substrate is gripped between the distal and proximal contact members and an open or ungripped position.

The linkage mechanism of the present invention eliminates the need for separate actuators to accomplish horizontal and vertical motion of the distal contact(s). Similarly, the need for small motions of the robot is minimized during substrate gripping and ungripping.

DESCRIPTION OF THE DRAWINGS

The invention will be more fully understood from the following detailed description taken in conjunction with the accompanying drawings in which.

DETAILED DESCRIPTION OF THE INVENTION

Figure 1:
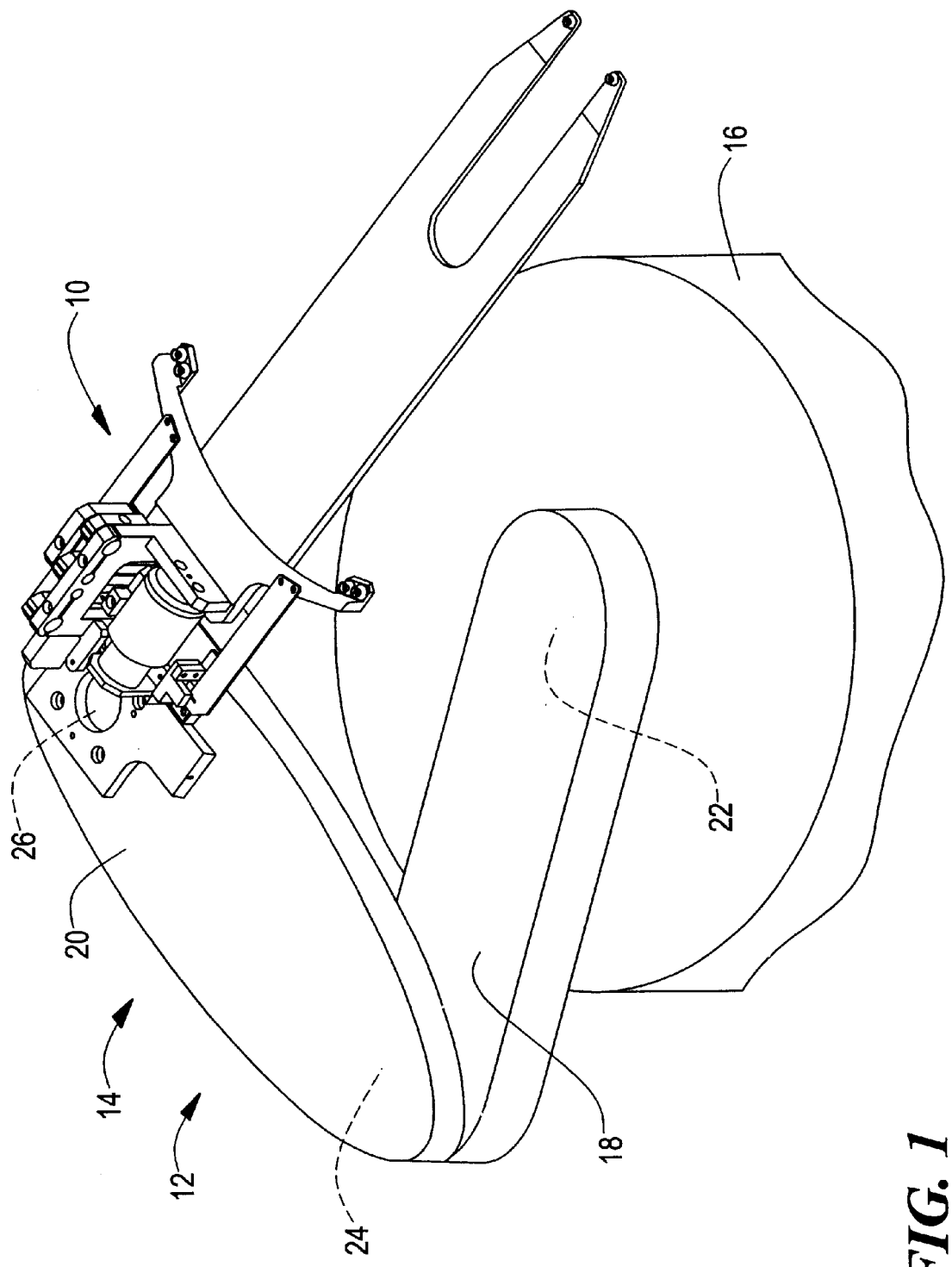
FIG. 1 is an isometric view of a robot arm and edge gripping device according to the present invention.

An edge gripping device 10 according to the present invention is illustrated in FIG. 1 in conjunction with a typical robot arm assembly 12. The robot arm assembly includes an arm 14 mounted on a support 16, such as a central column that houses a lifting mechanism (not shown) to raise and lower the arm vertically. The central column is rotatably mounted to turn the arm in a desired direction with the limits of its travel. The arm includes an inner arm 18, an outer arm 20, and the edge gripping device 10, which may also be referred to as an end effector. The inner arm 18 is supported by the central column 16 at a rotatable "shoulder" joint 22 to effect rotation about a vertical axis through the central column. Similarly, the outer arm 20 is mounted to the inner arm 18 at a rotatable "elbow" joint 24 for rotation about a vertical axis, and the edge gripping device 10 is mounted to the outer arm 20 at a rotatable "wrist" joint 26 for rotation about a vertical axis. The shoulder, elbow, and wrist joints are coordinated by suitable timing belts and pulleys to produce a straight-line radial translation of the end effector. It will be appreciated that the edge gripping device of the present invention can be used with other robotic arm configurations.

Figure 2:
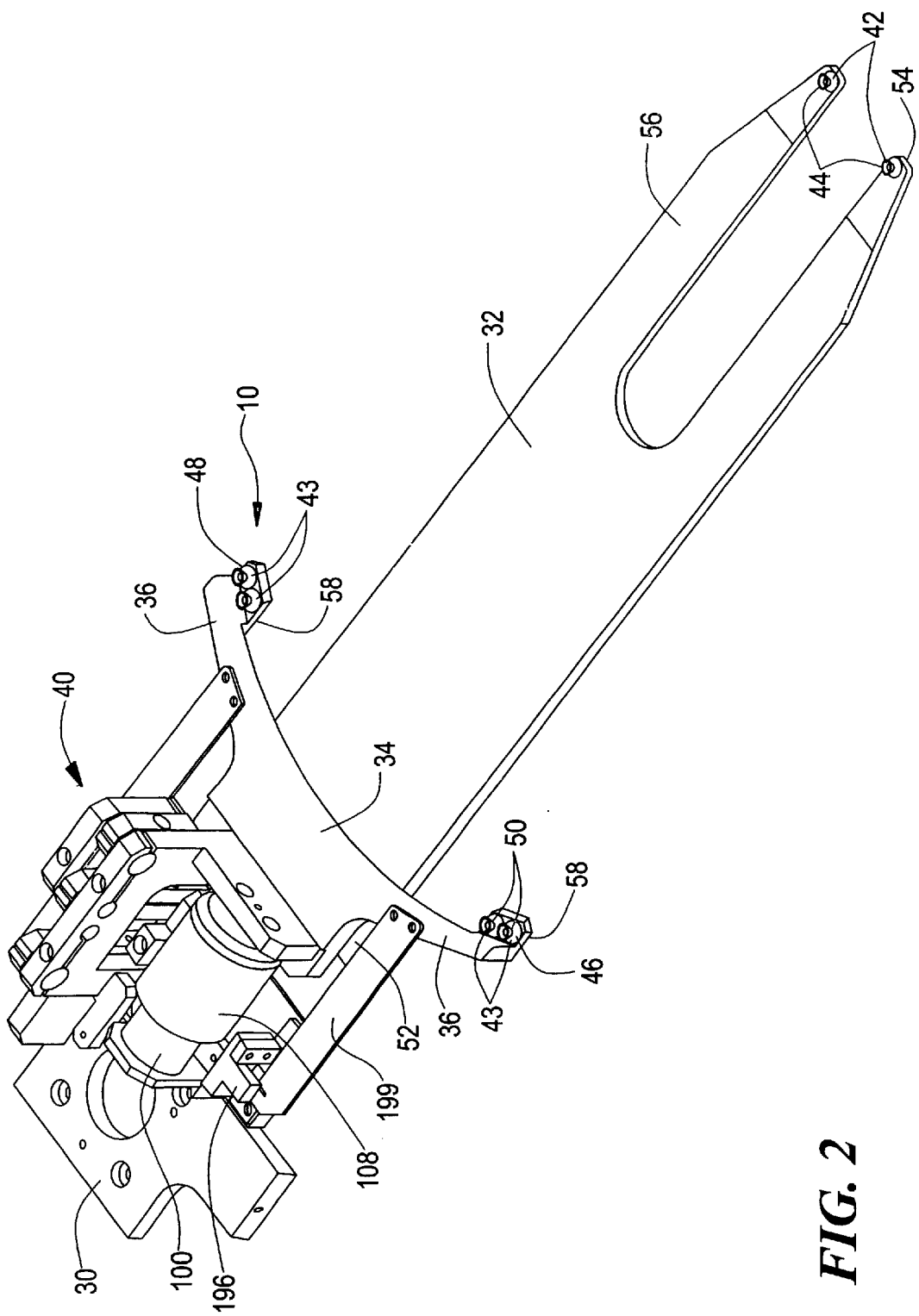
FIG. 2 is an isometric view of the edge gripping device of FIG. 1.
Figure 3:
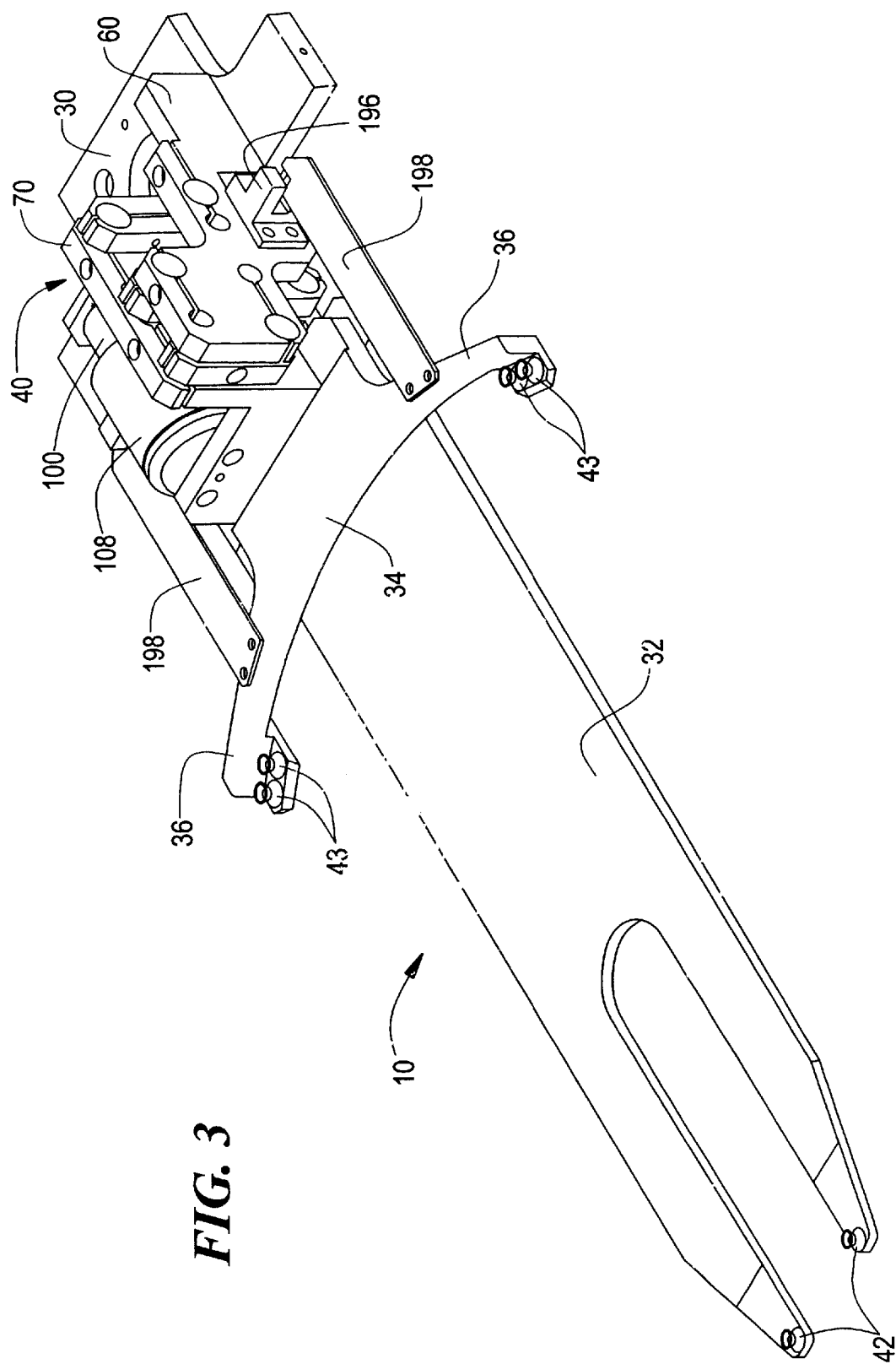
FIG. 3 is a further isometric view of the edge gripping device of FIG. 1.
Figure 4:
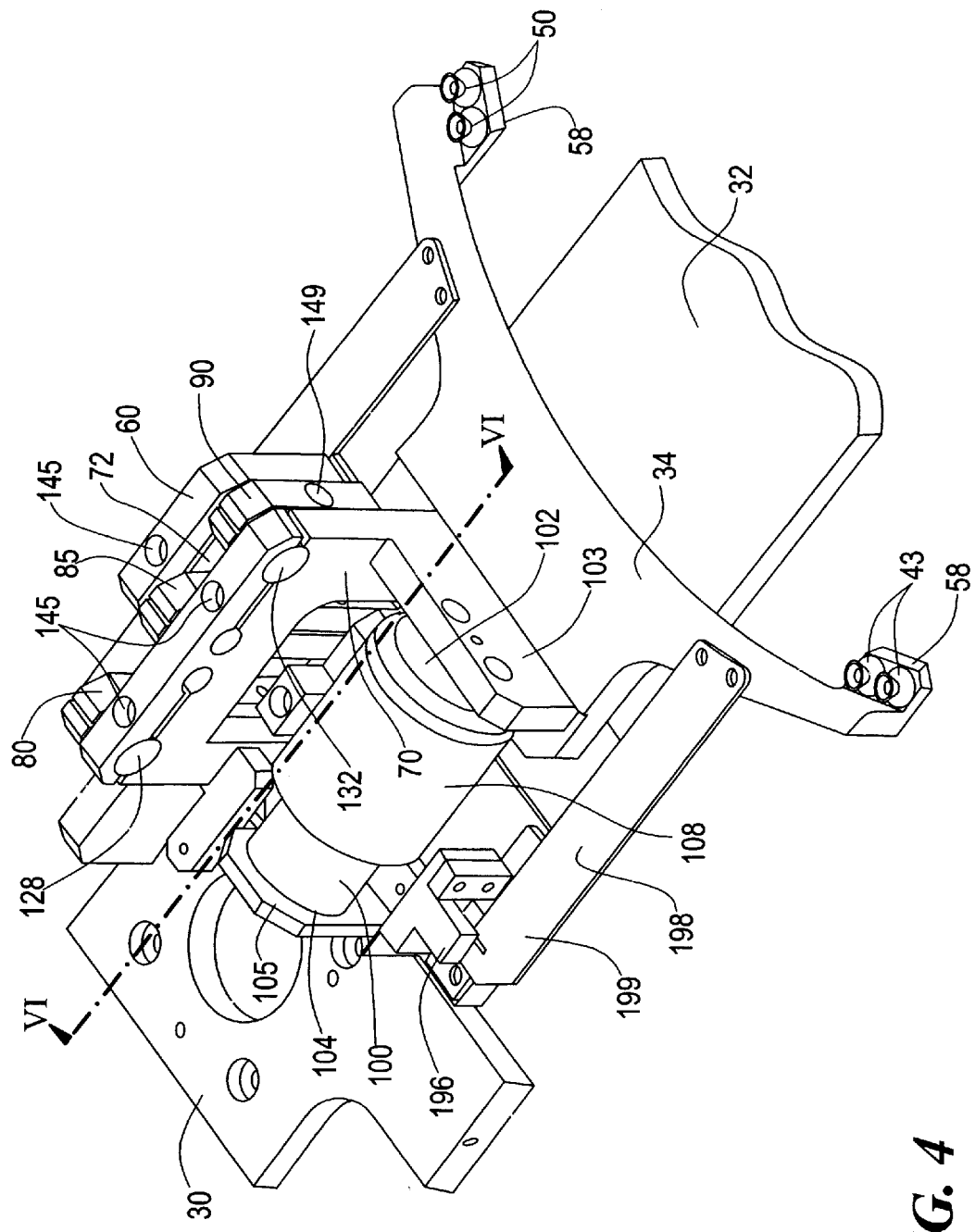
FIG. 4 is a partial view of the edge gripping device of FIG. 1.
Figure 5:
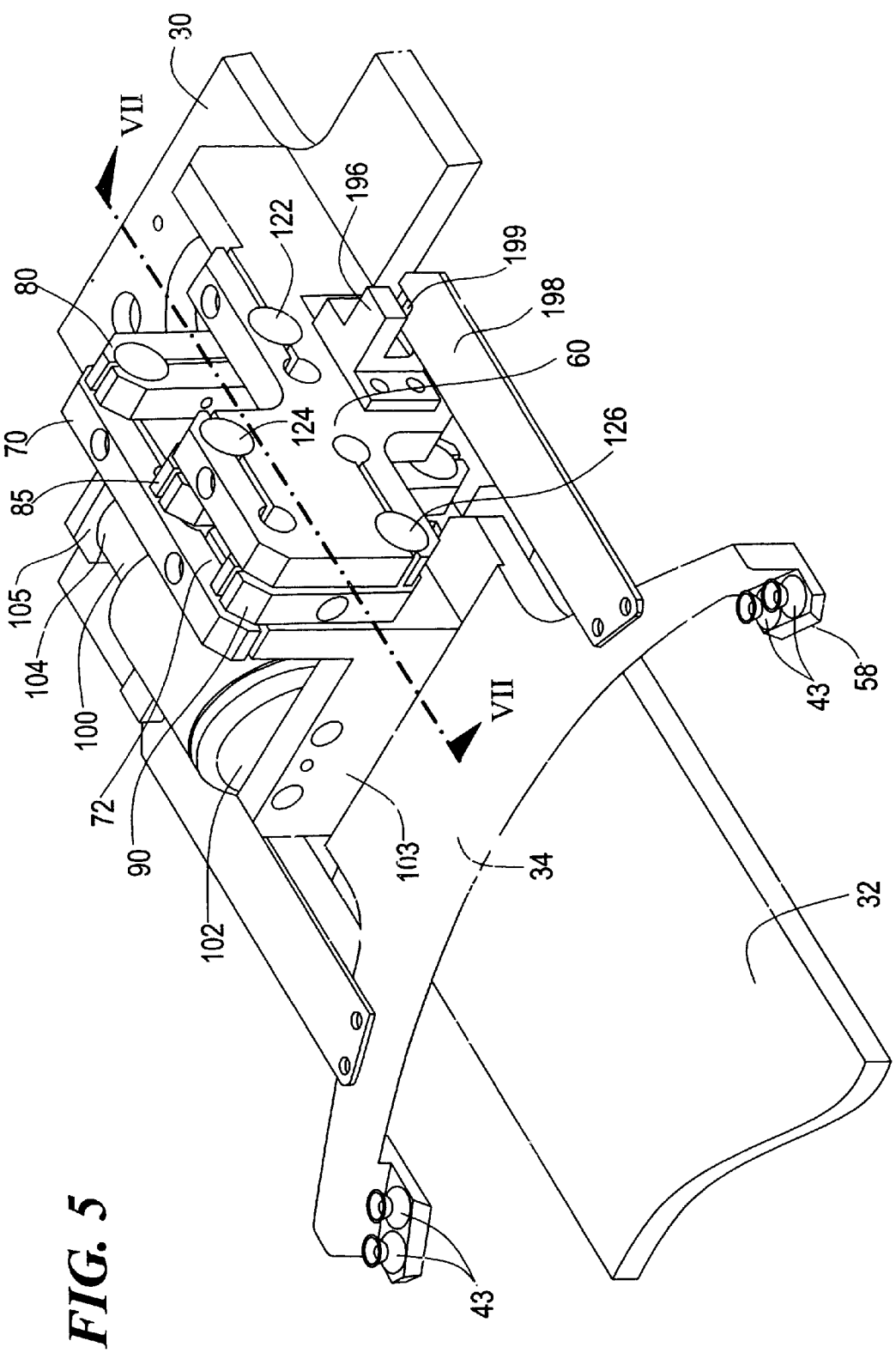
FIG. 5 is a partial view of the edge gripping device of FIG. 1.
Figure 6:
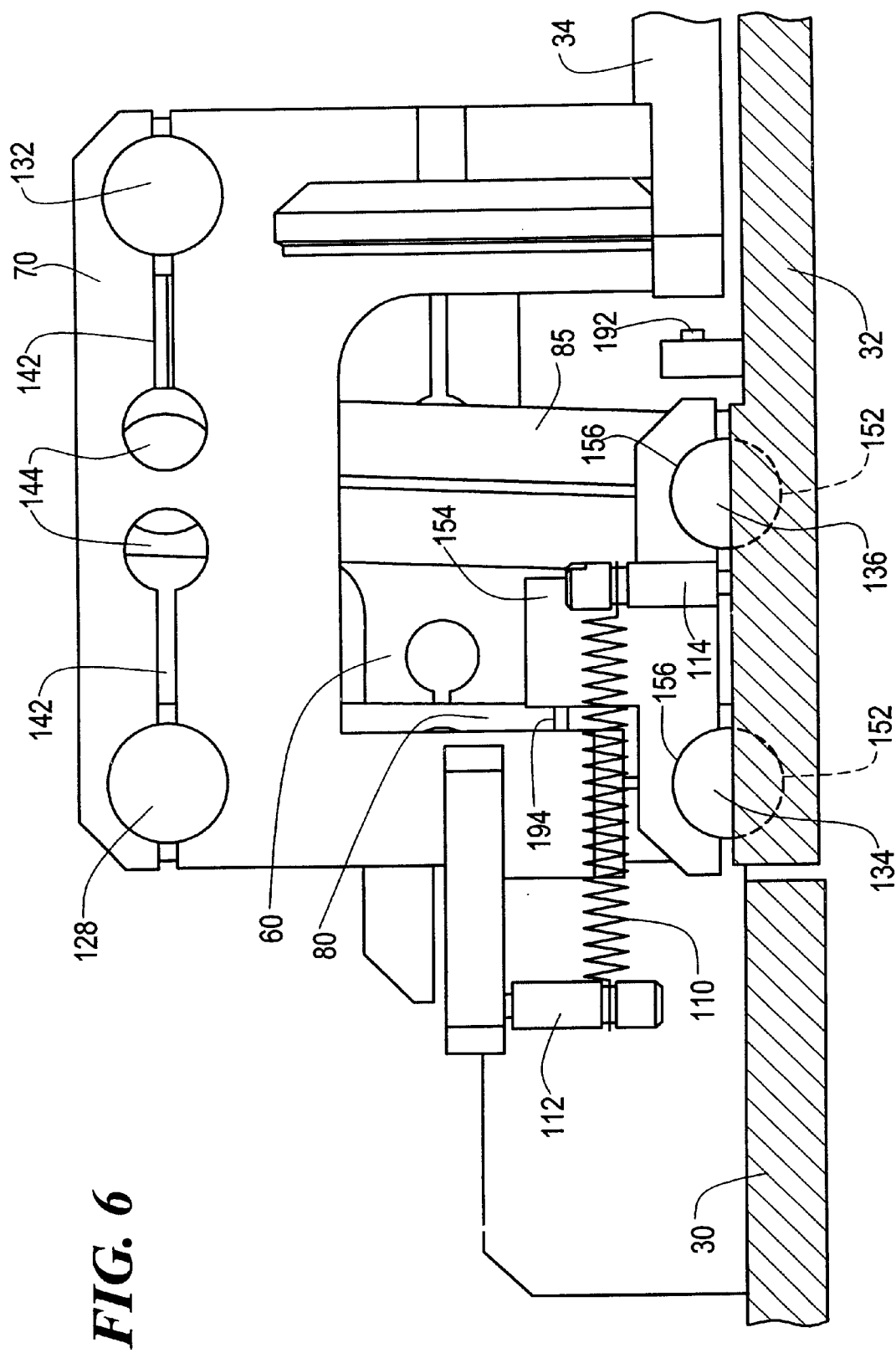
FIG. 6 is a partial cross-sectional view along line VI—VI of FIG. 4.
Figure 7:
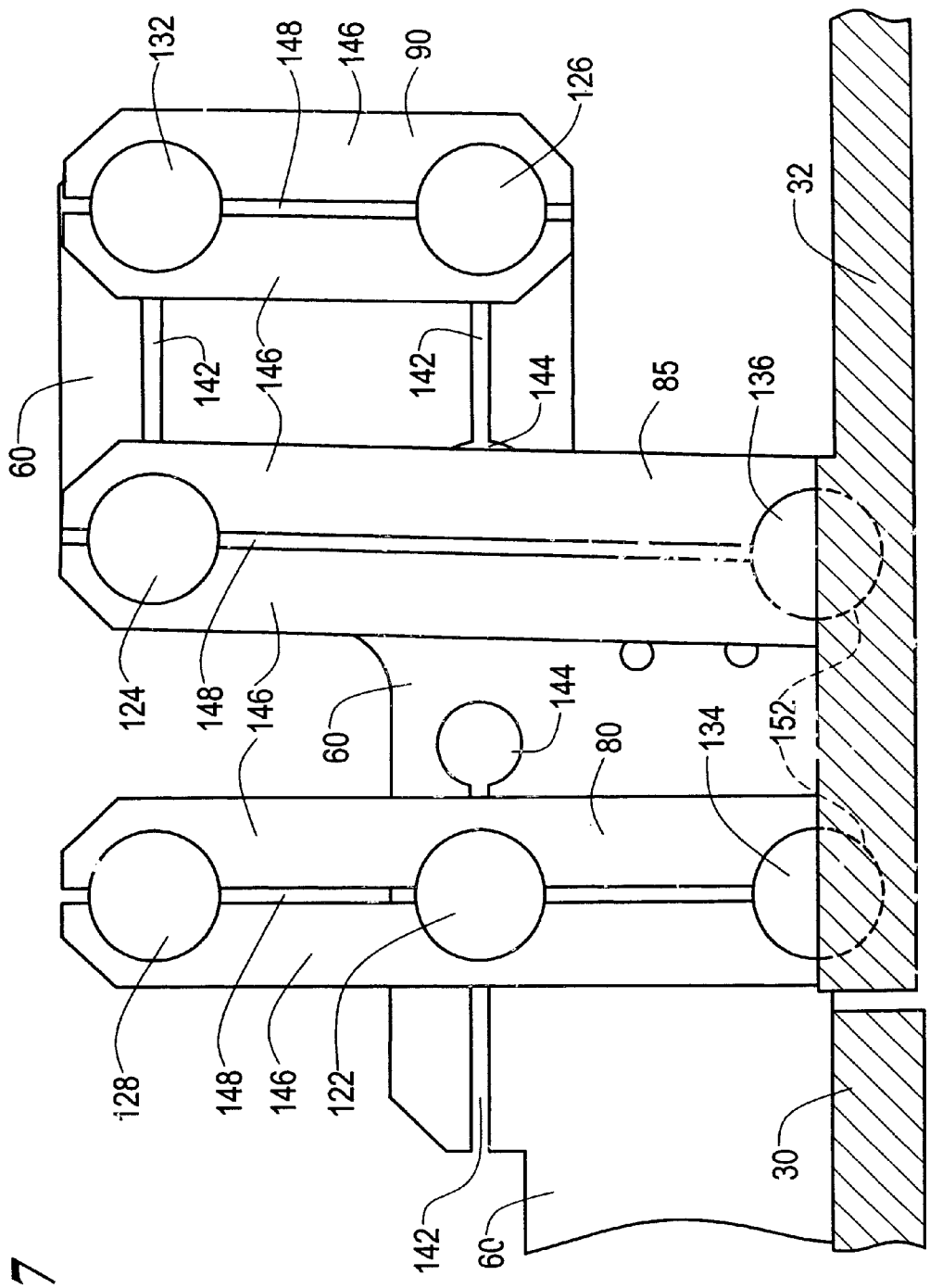
FIG. 7 is a partial cross-sectional view along line VII—VII of FIG. 5.

Referring to FIGS. 2 and 3, the edge gripping device includes a base 30 mounted at the wrist joint to the robot outer arm. A blade 32 and a pusher bar 34 having two extending arms 36 are movably mounted to the base 30 via a linkage mechanism 40, described further below. For purposes of describing the present invention, the term "distal" is a relative term that refers to the direction away from the wrist joint, toward the blade tip 54. The term "proximal" is a relative term that refers to the direction toward the wrist joint. In the embodiment illustrated, the base is mounted to the robot outer arm such that the distal and proximal directions coincide with the direction of radial motion.

Substrate edge contact members 42, 43 such as pins, are provided at the distal tip 54 of the blade 32 and at the ends of the two pusher arms 36 to provide at least three contact locations 44, 46, 48 for gripping an edge of a substrate. The pins are preferably hourglass-shaped in cross-section to provide a waist region 50 within which the edge of the substrate is captured. Although an hourglass-shaped contact pin is preferred, it will be appreciated that a contact member having another configuration, such as a straight or curved V-shaped notch, may be used if desired. For semiconductor processing applications, the pins are made from a non-conductive cleanroom-compatible plastic.

The blade 32 is configured to extend beneath a substrate, such as a semiconductor wafer in a stack of wafers. The blade may be optimized for minimal deflection, for example, by tapering the blade from the proximal end 52 near the base to the tip 54, as can be readily determined by one of skill in the art. At the distal tip 54 of the blade, at least one and preferably two contact pins 42 are provided. In the embodiment shown, the tip 54 of the blade is forked, which allows the end effector to accommodate a pre-aligner device, and a contact pin 42 is provided on the end of each tine 56 of the fork. It will be appreciated that the tip 54 need not be forked if a pre-aligner device is not used; in this case, a single pin or two abutting or closely spaced pins at the tip of the blade may be sufficient.

The pusher bar 34 is preferably crescent-shaped to accommodate a substrate having a circular configuration. At the outer ends of the pusher arms 36, at least one and preferably two pins 43 are provided, such as on extending lips 58. The pins 43 at the end of each arm are abutting or closely spaced at each location 46, 48, because certain substrates such as semiconductor wafers include an alignment feature in the form of a notch. If a single pin were used at each contact location 46, 48, one pin could potentially move into the notch during closure and shift the wafer out of the proper position on the edge gripping device. By providing two pins at each location, the pins cannot move into the notch, thereby preventing the wafer from shifting on the edge gripping device. In a similar manner, preferably two pins 42 are placed at the tip of the blade. Although not abutting in the illustrated embodiment, the two pins at the tip of each tine 56 are sufficiently close such that the pins cannot move into the notch. Some substrates may include a flat as an alignment feature rather than a notch. It will be appreciated that to accommodate a flat, one or more contact members that provide a sufficiently long curved edge or a number of contact points may be used.

The linkage mechanism 40 that movably mounts the blade and pusher bar to the base defines two interconnected four-bar linkages that share a stationary mounting link plate and one of several movable link arms. See FIGS. 4–7. The stationary mounting link plate 60 is fixed at one end to the base 30 and extends from the base in the distal direction. A parallel movable link plate 70 is fixed at one end to the pusher bar 34 and extends in the proximal direction toward the base 30. The stationary link plate 60 and the parallel movable link plate 70 extend parallel to each other in distal/proximal planes with a space 72 therebetween. Within the space, three movable link arms—a proximal link arm 80, an intermediate link arm 85, and a distal link arm 90—interconnect the stationary link plate 60 and the movable link plate 70 via a number of pivot points, described further below. The pusher bar 34 and the blade 36 share the proximal movable link arm 80 as well as the stationary link plate 60, also described further below. It will also be appreciated that the stationary link plate and the movable link plate do not necessarily have to have a plate-like configuration; for example, they may have a three-dimensional cage-like configuration. For ease of description, they will be referred to as plates herein.

An actuator 100 is provided having one end 102 fixed to the movable link plate 70 via an extension 103 and another end 104 fixed to the proximal end 52 of the blade 32 via an extension 105. The movable link plate 70 is also interconnected to the blade 32 via a biasing member 110, such as a tension spring, (see FIG. 6) that biases the blade and the pusher bar toward each other. The biasing member maintains the edge gripping device in a closed position in the absence of power. For example, the tension spring may extend between a post 112 integral with the movable link plate 70 and a post 114 integral with the blade 32. Activation of the actuator 100 moves the movable link plate 70, which is fixed to the pusher bar 34, and the proximal end 52 of the blade 32 apart against the biasing of the spring 110. Upon activation or deactivation, the movements of the blade and the pusher bar are constrained by the two four-bar linkages, discussed further below.

The linkage mechanism 40 has seven pivot points. Three pivot points 122, 124, 126 are provided within the stationary link plate 60 at a proximal location, an intermediate location, and a distal location, respectively. Two pivot points 128, 132 are provided at a proximal and a distal location in an upper region within the movable link plate 70. Two pivot points 134, 136 are provided at a proximal location and an intermediate location on or within an upper surface of the blade 32. The four pivot points 128, 132, 134, 136 within the movable link plate and the blade are displaceable with movement of the movable link plate and the blade.

The proximal movable link arm 80 interconnects with the movable link plate 70, the stationary link plate 60, and the blade 32 at three of the pivot points 122, 128, 134. The displaceable proximal pivot point 128 on the movable link plate 70 interconnects with the proximal movable link arm 80 at an upper region. The stationary proximal pivot point 126 on the stationary link plate 60 interconnects with the proximal movable link arm 80 at a midpoint. The displaceable proximal pivot point 134 on the blade 32 interconnects with the proximal movable link arm 80 at a lower region.

The intermediate movable link arm 85 interconnects with the stationary link plate 60 and the blade 32 at two of the pivot points 124, 136. The stationary intermediate pivot point 124 on the stationary link plate 60 interconnects with the intermediate movable link arm 85 at an upper region. The displaceable intermediate pivot point 136 on the blade 32 interconnects with the intermediate movable link arm 85 at a lower region.

The distal movable link arm 90 interconnects with the movable link plate 70 and the stationary link plate 60 at two of the pivot points 132, 126. The displaceable distal pivot point 132 on the movable link plate 70 interconnects with the distal movable link arm 90 at an upper region. The stationary distal pivot point 126 on the stationary link plate 60 interconnects with the distal movable link arm 90 at a lower region.

Preferably, the pivot points 122, 124, 126, 128, 132, 134, 136 are formed by flexural pivots that have no sliding motion that could generate particles. Suitable flexural pivots are commercially available, for example, from Lucas Aerospace Power Transmission in Utica, N.Y. The flexural pivots are contained within suitable openings formed in the link arms and plates. Suitable slots 142 and relief openings 144 are provided within the stationary link plate 60 and the movable link plate 70 associated with each pivot point. Screws (for clarity, not shown) extend through aligned threaded holes 145, traversing the slots, to clamp the plates and allow adjustment of the flexural pivots. Similarly, the proximal movable link arm 80, the intermediate movable link arm 85, and the distal movable link arm 90 are each formed as two elongated pieces 146 separated by a space 148. Screws (for clarity, not shown) extend through aligned threaded holes 149 in the pieces, traversing the spaces, to hold the two pieces of each movable link arm together and allow adjustment of the flexural pivots. At the blade 32, two semicircular openings 152 are recessed in the upper surface of the blade to receive the flexural pivots therein. A hold-down piece 154 having corresponding semicircular recessed openings 156 in a lower surface thereof is adjustably fastened to the blade with a screw (for clarity, not shown) to hold the flexural pivots in the recessed openings. See FIGS. 6 and 7. Other types of pivots, such as shaft and bearing pivots, may be used, particularly if particle generation were not a concern or if the mechanism were enclosed.

Figure 8:
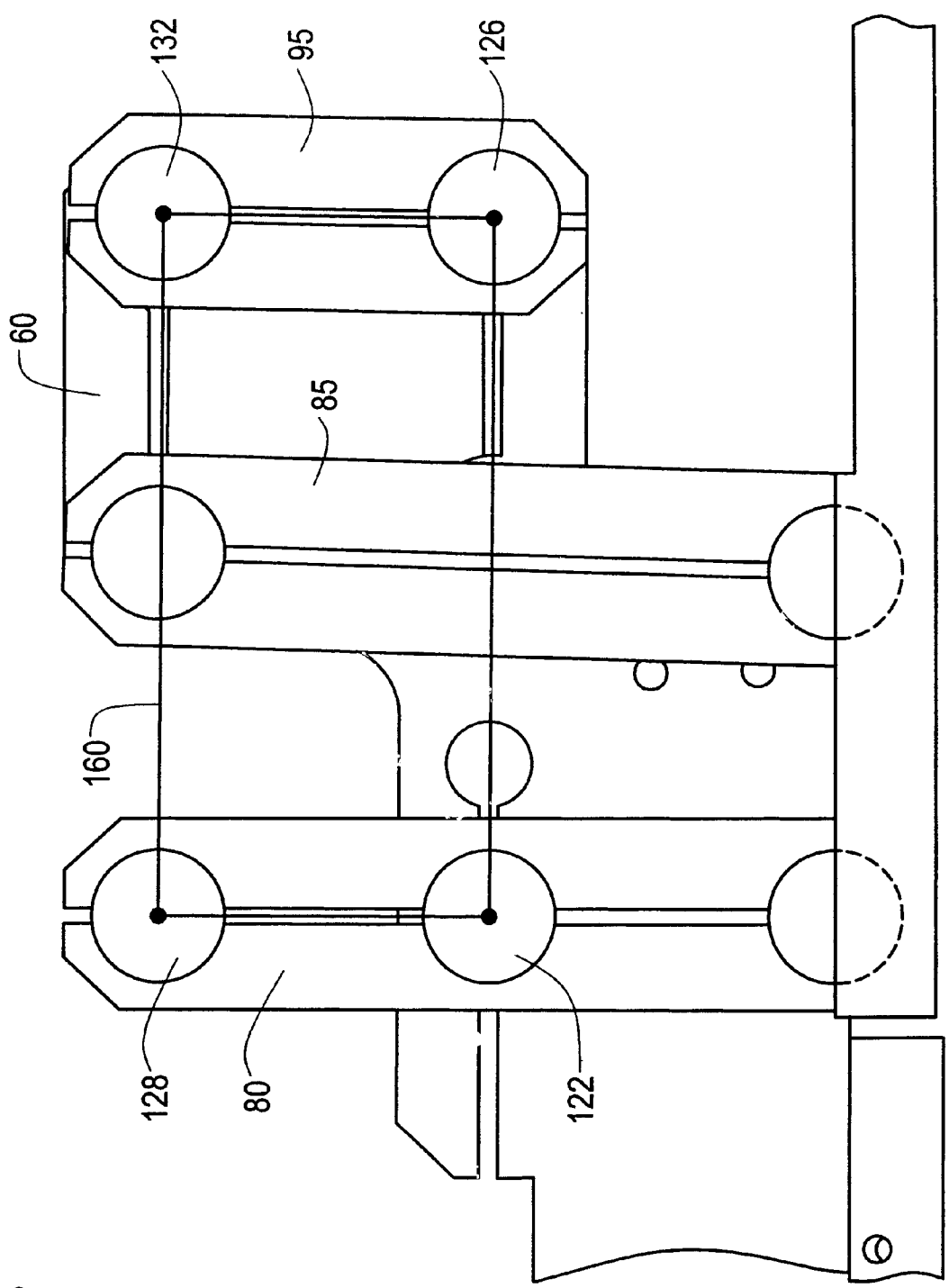
FIG. 8 is a partial view as in FIG. 7 further schematically illustrating the parallelogram linkage of the present invention.
Figure 10:
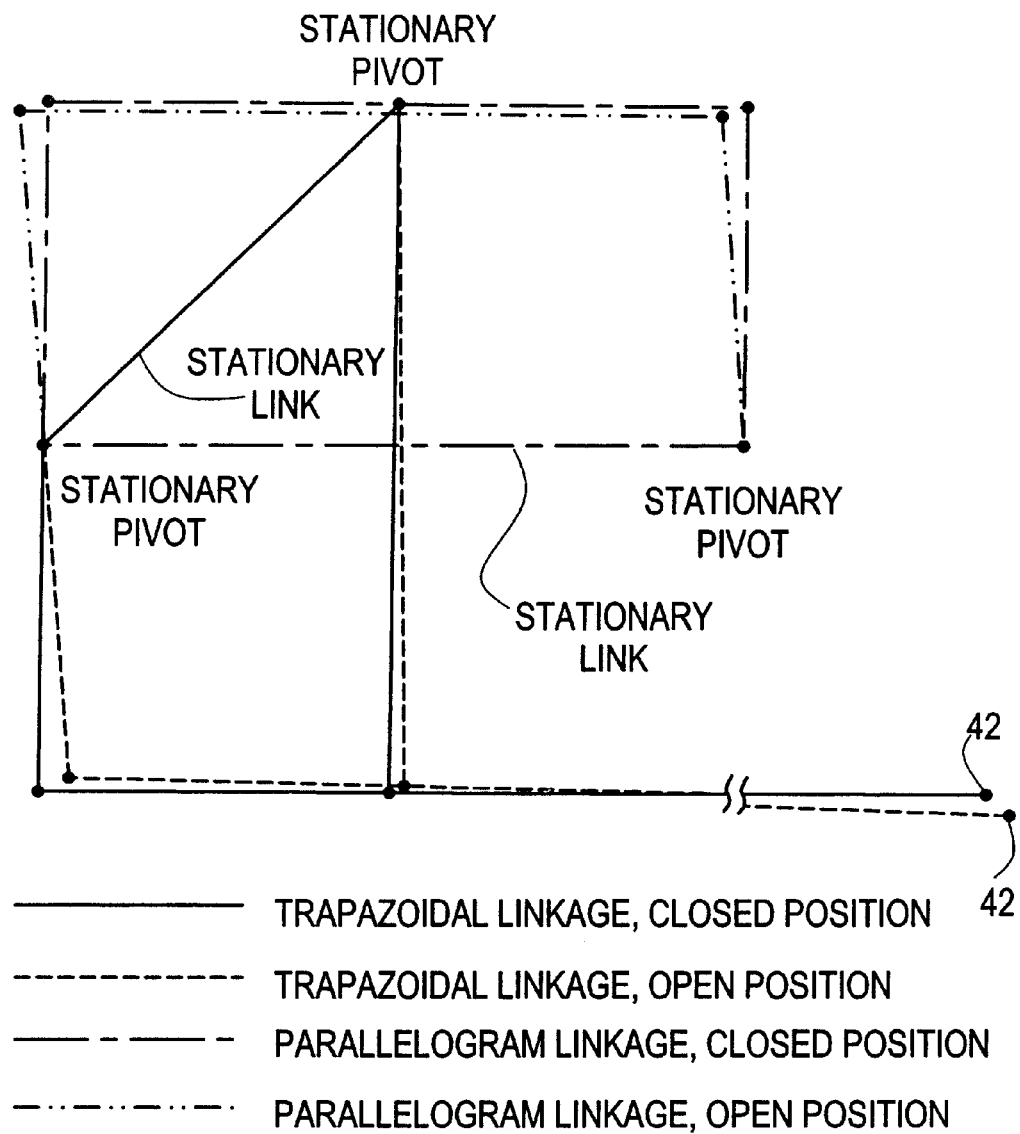
FIG. 10 is a schematic illustration of the parallelogram linkage and the trapezoidal linkage in the open and closed positions.

As noted above, the linkage mechanism 40 defines two four-bar linkages to move the pusher bar and the blade. A first four-bar linkage 160 that moves the proximal contact members on the pusher bar is a parallelogram that causes nearly horizontal motion. See FIG. 8. The first linkage is defined by the displaceable proximal pivot point 128 interconnecting the proximal movable link arm 80 and the movable link plate (for clarity, not shown in FIG. 8), the displaceable distal pivot point 132 interconnecting the distal movable link arm 90 and the movable link plate, the stationary distal pivot point 126 interconnecting the distal movable link arm 90 and the stationary link plate 60, and the stationary proximal pivot point 122 interconnecting the proximal movable link arm 80 and the stationary link plate 60. In FIG. 8, the solid line connecting the four pivot points illustrates the linkage in the closed position. FIG. 10 illustrates schematically the parallelogram linkage 160 in the closed position in single dotted-dashed lines and in the open position in double dotted, dashed lines. A linkage other than parallelogram may be used as long as the motion is sufficiently horizontal when the contact members contact the substrate.

Figure 9:
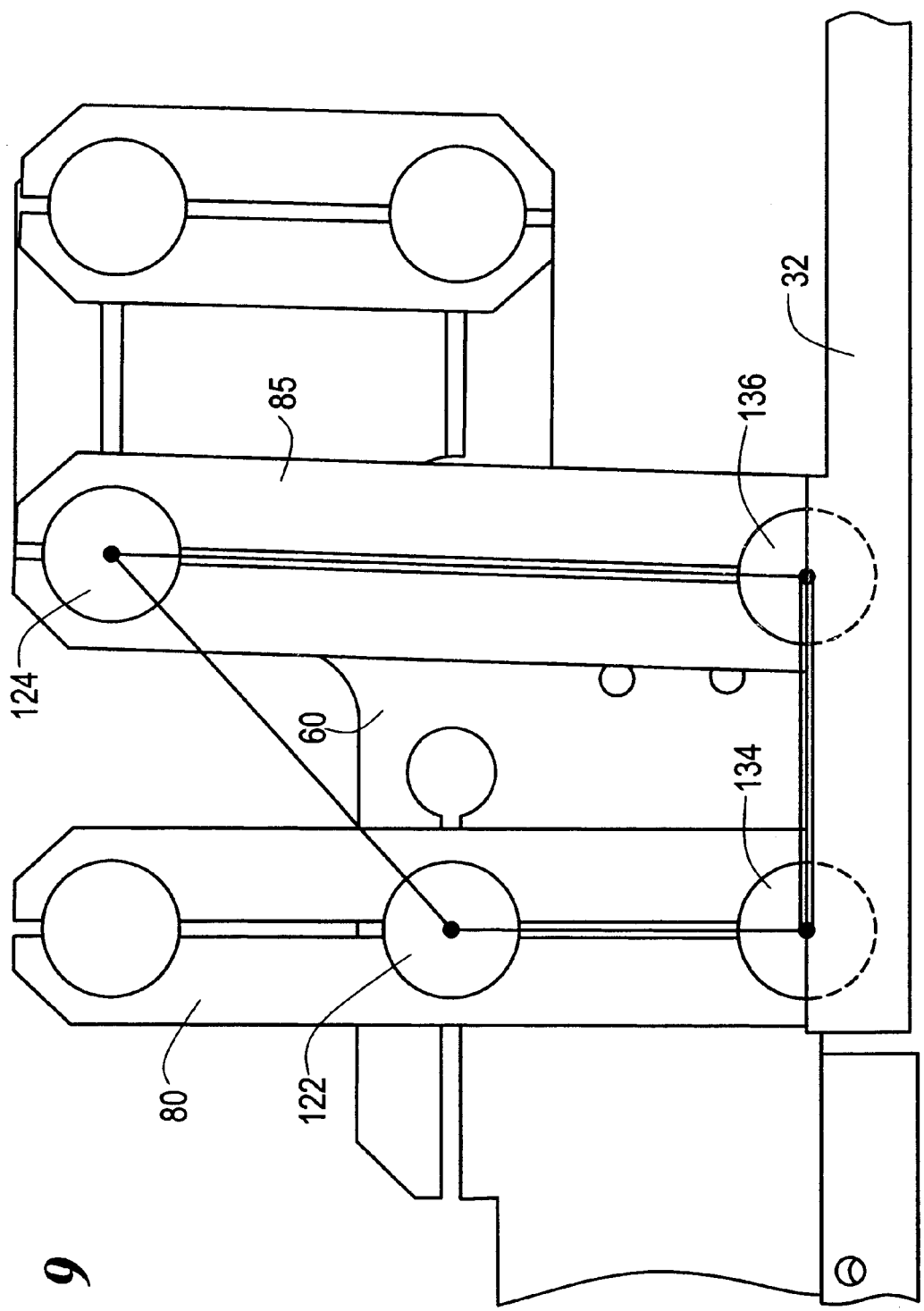
FIG. 9 is a partial view as in FIG. 7 further schematically illustrating the trapezoidal linkage of the present invention.

A second four-bar linkage 170 (see FIG. 9) that moves the distal pins is trapezoidal to create a profiled motion that is nearly horizontal when the distal pins are near the substrate and moves the distal pins down out of the plane of the substrate as the edge gripping device opens away from the substrate. Thus, the second linkage moves the distal pins on the blade along a curved path upwardly and inwardly to a closed position and downwardly and outwardly to an open position. The second linkage 170 is defined by the stationary proximal pivot point 122 interconnecting the proximal movable link arm 80 and the stationary link plate 60, the stationary intermediate pivot point 124 interconnecting the intermediate movable link arm 85 and the stationary link plate 60, and the two lower proximal and intermediate pivot points 134, 136 interconnecting the blade 32 and the proximal and intermediate movable links arms 80, 85 respectively. In FIG. 9, the solid line connecting the four pivot points illustrates the linkage in the closed position. FIG. 10 illustrates schematically the trapezoidal linkage 170 in the closed position in solid lines and in the open position in dashed lines. As can be seen, the trapezoidal configuration of the linkage causes the blade effectively to tilt such that the distal pins 42 at the end of the blade moves downwardly and outwardly upon opening.

As noted above, one end 102 of the actuator 100 is fixed to the movable link plate 70 and the other end 104 is fixed to the movable blade 32, thereby doubling the stroke of the actuator compared to a stationary mounting. The actuator may be of any suitable type, such as a pneumatic (linear or rotary) actuator, solenoid actuator, vacuum actuator, or a motor. The gripping speed and force at impact may be suitably controlled to reduce impact forces on the substrate. For example, by controlling the exhaust of a vacuum actuator through a suitably sized orifice, the gripping speed and force at impact can be reduced as the pins contact the substrate. The linkage mechanism 40 of the present invention eliminates the need for separate actuators to accomplish horizontal and vertical motion of the distal pins. Similarly, the need for small motions of the robot is minimized during substrate gripping and ungripping.

In operation, the robot arm 14 moves the edge gripping device 10 beneath a substrate to be gripped with the actuator activated to hold the edge gripping device open. The robot arm under the control of a suitable controller is able to locate the edge gripping device sufficiently accurately beneath the substrate, for example, by learning the configuration of a substrate at a particular station during installation, as is known in the art. The robot arm slides the edge gripping device beneath the substrate with the waist regions of the proximal pins approximately horizontally aligned with the edges of the substrate. The actuator is then deactivated to allow the edge gripping device to close. The upward and inward motion of the second linkage causes the distal pins to rise upwardly until the waist regions of both the proximal and distal pins are substantially horizontally aligned with and begin to contact the edge of the substrate. In this manner, the pins come into gripping contact with the edge of the substrate without any additional vertical component of motion from the robot arm. The hourglass shape of the pins further helps to align and center the substrate between the three contact locations. Also, by grasping the substrate simultaneously from the distal and proximal sides, sliding motion of the substrate on the pins is minimized. When the substrate is firmly gripped, the robot arm transfers the substrate to the appropriate destination.

Although the robot arm learns the general location of the substrates to be picked up from a known source, the substrates may be offset slightly on their supports or may be slightly warped. The edge gripping device is able to automatically center a substrate within the contacts even if the substrate is slightly offset or warped. Preferably, the edge gripping device is able to center substrates such as semiconductor wafers that are offset within a 4.0 mm diameter tolerance zone, which is suitable for most 300 mm semiconductor wafer handling applications.

With the present invention, the zone around the circumference of the substrate that is contacted by the edge gripping device, also called the edge exclusion, is minimized. For example, in the semiconductor wafer processing industry, the edge exclusion must be no greater than 3 mm. The present invention minimizes the edge exclusion to a maximum of 1 mm.

The range of motion of the blade is preferably controlled by stops. See FIG. 6. In the embodiment illustrated, one stop 192, provided on a mounting on the blade, abuts a rear surface of the pusher bar, limiting the outward and downward opening motion. Another stop 194, provided on a downward extension of the movable link plate, abuts the hold-down piece 154 to limit the closing motion. By limiting the downward motion, the edge gripping device is able to fit between closely spaced substrates, such as semiconductor wafers stored in a wafer carrier or in other restricted spaces. The stops are preferably formed from screws so that the limits of motion can be adjusted as desired. It will be appreciated that the stops may be provided in other configurations and locations.

One or more sensors are provided to detect whether the edge gripping device is in the open or closed position or to detect an over-traveled closed position. In the embodiment illustrated, flags 198 extend from the pusher bar to associated detectors 196. In an open position, the flag occludes a light path in the detector. In the closed position, a slit or other opening 199 in the flag prevents occlusion of the light path. It will be appreciated that any suitable number of sensors, including a single sensor or a second sensor to distinguish between an open and an over-traveled closed position, may be provided. Similarly, other types of sensors may be provided.

A cover 108 may be provided over the actuator to contain any particles that may be generated. Similarly, a cover (not shown) may be provided over the linkage mechanism.

The invention is not to be limited by what has been particularly shown and described, except as indicated by the appended claims.

What is claimed is:

1. An edge gripping device for gripping and ungripping substrates comprising:
    a base;
    a distal member extending from the base in a distal direction and having at least one distal contact member at a distal location;
    a proximal member having at least one proximal contact member thereon at a proximal location;
    a linkage mechanism movably mounting the distal member and the proximal member to the base, comprising:
        a first four-bar linkage comprising a stationary link fixed with respect to the base and three movable links,
        the proximal member fixed to at least one of the movable links of the first linkage for movement therewith, and
        a second four-bar linkage comprising a stationary link fixed with respect to the base and three movable links,
        the distal member fixed to at least one of the movable links of the second linkage for movement therewith; and
        an actuator having one end fixed with respect to the first linkage and an opposite end fixed with respect to the second linkage, the actuator operative to move the first linkage and the second linkage to effect movement of the proximal contact member and the distal contact member between an open position and a closed position.

2. The edge gripping device of claim 1, wherein the distal member is fixed to the second linkage at a proximal end and the distal location of the distal contact member is located a sufficient distance from the proximal location such that the second linkage effects vertical and horizontal motion of the distal contact member.

3. The edge gripping device of claim 1, wherein the linkage mechanism further comprises a stationary link plate fixed with respect to the base, the stationary link of the first linkage and the stationary link of the second linkage defined by pivot points on the stationary link plate.

4. The edge gripping device of claim 3, wherein the linkage mechanism further comprises:
    a movable link plate spaced from the stationary link plate; and
    a plurality of link arms pivotally interconnecting the stationary link plate and the movable link plate.

5. The edge gripping device of claim 4, wherein the link arms comprise:
    a proximal link arm pivotally connected at a pivot point to the movable link plate and pivotally connected to the distal member at a pivot point and pivotally connected to the stationary link plate at a stationary pivot point;
    a distal link arm pivotally connected at a pivot point to the movable link plate and pivotally connected to the stationary link plate at a pivot point; and
    an intermediate link arm pivotally connected to the stationary link plate at a pivot point and pivotally connected to the distal member at a pivot point.

6. The edge gripping device of claim 5, wherein the first linkage and the second linkage share the stationary pivot point connecting the proximal link to the stationary link plate.

7. The edge gripping device of claim 5, wherein the first linkage and the second linkage share the proximal link arm.

8. The edge gripping device of claim 1, wherein the first four-bar linkage comprises a parallelogram configuration.

9. The edge gripping device of claim 1, wherein the first four-bar linkage is configured to provide horizontal motion of the proximal contact member.

10. The edge gripping device of claim 1, wherein the second four-bar linkage comprises a trapezoidal configuration.

11. The edge gripping device of claim 1, wherein the second four-bar linkage is configured to provide vertical and horizontal motion of the distal contact member.

12. The edge gripping device of claim 11, further comprising a stop member disposed to limit outward and downward motion of the distal contact member.

13. The edge gripping device of claim 11, further comprising a stop member disposed to limit inward and upward motion of the distal contact member.

14. The edge gripping device of claim 1, further comprising a biasing member disposed to maintain the proximal member and the distal member in the closed position.

15. The edge gripping device of claim 14, wherein the biasing member comprises a tension spring fixed at one end to the proximal member and fixed at an opposite end to the linkage mechanism.

16. The edge gripping device of claim 1, wherein:

the proximal member comprises a pusher bar having extending arms; and the at least one proximal contact member comprises a first proximal contact member disposed on one of the extending arms and a second proximal contact member disposed on another of the extending arms.

17. The edge gripping device of claim 16, further comprising an additional first proximal contact member abutting the first proximal contact member and an additional second proximal contact member abutting the second proximal contact member.

18. The edge gripping device of claim 16, wherein the pusher bar has a curved configuration to conform to a circular substrate.

19. The edge gripping device of claim 1, wherein the distal member comprises a blade, the at least one distal contact member disposed on a distal end of the blade.

20. The edge gripping device of claim 19, wherein:

the blade includes a pair of tines at the distal end and;

the at least one distal contact member comprises two distal contact members located on associated ones of the pair of tines.

21. The edge gripping device of claim 19, wherein the blade is tapered in thickness in the distal direction.

22. The edge gripping device of claim 1, further comprising at least one sensor disposed to detect the closed position.

23. The edge gripping device of claim 1, further comprising at least one sensor disposed to detect an over-traveled closed position.

24. The edge gripping device of claim 1, further comprising at least one sensor disposed to detect the open position.

25. The edge gripping device of claim 1, wherein the actuator is operative to control forces of the proximal contact member and the distal contact member on the substrate.

26. The edge gripping device of claim 1, wherein the contact members have a waist region or notch therein to retain an edge of the substrate.

27. The edge gripping device of claim 1, wherein the contact members are formed of a cleanroom compatible material.

28. The edge gripping device of claim 1, further comprising a stop member disposed to limit motion of the distal contact member.

29. A robot assembly including the edge gripping device of claim 1 for transporting substrates comprising:

a robot arm movable in horizontal and vertical planes, wherein the base of the edge gripping device is mounted to an end of the robot arm.

30. The robot assembly of claim 29, wherein the robot assembly is sized and configured to transport semiconductor wafers.

31. An edge gripping device for a robot arm for gripping and ungripping substrates, comprising:

a robot arm movable in horizontal and vertical planes;

a base fixed to an end of the robot arm;

a blade extending from the base in a distal direction and having at least one distal substrate edge contact member at a distal location;

a pusher bar having at least one proximal substrate edge contact member thereon at a proximal location;

a linkage mechanism movably mounting the blade and the pusher bar to the base, comprising:

a first four-bar linkage comprising a stationary link fixed with respect to the base and three movable links connected in a parallelogram configuration, the proximal member fixed to at least one of the movable links of the first linkage for movement therewith, and a second four-bar linkage comprising a stationary link fixed with respect to the base and three movable links connected in a trapezoidal configuration, the blade fixed to at least one of the movable links of the second linkage for movement therewith; and an actuator having one end fixed with respect to the first linkage and an opposite end fixed with respect to the second linkage, the actuator operative to move the first linkage and the second linkage to effect movement of the proximal contact member and the distal contact member between an open position and a closed position in which a substrate is gripped between the distal and proximal contact members.

32. The edge gripping device of claim 31, wherein the contact members are hourglass-shaped comprising a waist region to retain an edge of a semiconductor wafer.

33. The edge gripping device of claim 31, wherein the contact members are formed of a cleanroom compatible material.

34. The edge gripping device of claim 31, further comprising a stop member disposed to limit outward and downward motion of the distal contact member.

35. The edge gripping device of claim 31, further comprising a stop member disposed to limit inward and upward motion of the distal contact member.

36. The edge gripping device of claim 31, further comprising a biasing member disposed to maintain the blade and the pusher bar in the closed position.

37. The edge gripping device of claim 36, wherein the biasing member comprises a tension spring fixed at one end to the blade and fixed at an opposite end to the linkage mechanism.

* * * * *

UNITED STATES PATENT AND TRADEMARK OFFICE
CERTIFICATE OF CORRECTION

PATENT NO.    : 6,623,235 B2
DATED         : September 23, 2003
INVENTOR(S)   : Chuckson Yokota et al.

It is certified that error appears in the above-identified patent and that said Letters Patent is hereby corrected as shown below:

Column 3,
Line 10, "gripping device" should read -- gripping device 10 --.

Signed and Sealed this

Fourteenth Day of September, 2004

JON W. DUDAS
*Director of the United States Patent and Trademark Office*